United States Patent [19]

Kennedy

[11] Patent Number: 5,703,490
[45] Date of Patent: Dec. 30, 1997

[54] CIRCUIT AND METHOD FOR MEASURING CURRENT IN AN H-BRIDGE DRIVE NETWORK

[75] Inventor: Dennis M. Kennedy, Glendale, Ariz.

[73] Assignee: Honeywell Inc., Minneapolis, Minn.

[21] Appl. No.: 508,725

[22] Filed: Jul. 28, 1995

[51] Int. Cl.⁶ .................................................. G01R 27/28
[52] U.S. Cl. ........................ 324/650; 324/651; 324/725; 363/98
[58] Field of Search .............................. 324/522, 537, 324/650, 651, 713, 725, 771, 119; 318/293; 363/17, 98, 132

[56] References Cited

U.S. PATENT DOCUMENTS

| | | | |
|---|---|---|---|
| 4,677,356 | 6/1987 | Tsuneda et al. | 318/293 X |
| 4,710,686 | 12/1987 | Guzik | 318/293 |
| 4,978,898 | 12/1990 | Tsukahara et al. | 318/293 X |
| 5,309,078 | 5/1994 | Cameron | 318/811 |
| 5,343,382 | 8/1994 | Hale et al. | 363/98 |
| 5,477,151 | 12/1995 | Houston | 324/537 |
| 5,483,167 | 1/1996 | Mikami | 324/771 X |
| 5,552,684 | 9/1996 | Wada et al. | 318/293 |

*Primary Examiner*—Glenn W. Brown
*Attorney, Agent, or Firm*—Brian C. Downs; Ronald E. Champion

[57] ABSTRACT

A circuit measures the driving and circulating current in an H-bridge drive network directly and linearly. Voltage across two current sensing resistors are input to two precision half-wave rectifiers. The output of the rectifiers are input to a differential amplifier via a circuit of resistors. The output of the differential amplifier is a signal representative of the current in the H-bridge for both the driven periods and non-driven or freewheeling periods.

14 Claims, 5 Drawing Sheets

CIRCUIT AND METHOD FOR MEASURING CURRENT IN AN H-BRIDGE DRIVE NETWORK

BACKGROUND OF INVENTION

The present invention relates generally to control circuits and more specifically to feedback control circuits for H-bridge drive networks.

Control systems are widely used to control numerous items from household appliances to large industrial machines including ships, power plants, and, specifically, aircraft.

Control systems have been developed to control many types of devices and for many different applications. One type of control application deals with controlling servomotors (e.g. electric motors) which are capable of generating force in both a forward and a reverse direction. This type of servomotor, for example, can be used to control autothrottles, wing flaps, ailerons, and the rudder of an aircraft.

Typically these types of servomotors (and other devices) are controlled using an electrical circuit known as an H-bridge network 10 as illustrated in FIGS. 1A through 1C.

As illustrated in FIG. 1A, H-bridge network 10 includes a power input 11, four gates or switches 12A, 12B, 12C and 12D, and a servo or load 13. Power is supplied at input 11 which is connected to the upper legs 14A and 14C. Both lower legs 14B and 14D are connected to ground. Control of load 13 is accomplished as follows.

Power is supplied via input 11. Power may be in various formats but often pulse width modulation(PWM) or similar power signal is used.

Initially gates 12A and 12C are off and gates 12B and 12D are on. In this configuration no power is supplied to drive load 13. To drive load 13 in a first direction, gate 12A is turned on and gate 12B is turned off. In this configuration current, known as driven current, flows from input 11, through gate 12A, through load 13, and through gate 12D to ground as shown in FIG. 1B.

Drive current is turned off by turning off gate 12A and turning on gate 12B. It is important that gate 12B is turned on which permits the inductor current from load 13 to "freewheel" as illustrated in FIG. 1C thus reducing EMI and current and voltage anomalies which could damage circuit components.

To drive servo 13 in the opposite direction, gate 12C is turned on and gate 12D is turned off permitting current flow through servo 13 in the reverse direction as illustrated in FIG. 1D.

Drive current is turned off by turning off gate 12C and turning on gate 12D (thereby permitting current to freewheel) as illustrated in FIG. 1E.

H-bridges work well for driving a load. However, they have a problem in communicating feedback to a controller. Feedback is required for all feedback control systems. Feedback commonly is some electrical signal representative of a voltage, current or status of a system.

The prior art uses a current sensing circuit 20 illustrated in FIG. 2 to generate a feedback signal. The use of a resistor for current sense allows measurement of D.C. currents.

FIG. 2 shows current sensing resistors 21A and 21B connecting lower legs 14B and 14D to ground. Differential amplifier 22 connects to both lower legs 14B and 14D thereby measuring voltage across sensing resistors 21A and 21B. The voltage is representative of the current through the sensing resistors. Differential amplifier 22 generates a differential signal representative of the difference in voltage across the sensing resistors. This differential signal is communicated back to the controller.

A problem with the prior art circuit is that freewheel current is measured incorrectly. This is so since the freewheeling current travels "backwards" (i.e. opposite of driven current) through one of the sensing resistors. This is illustrated in FIG. 3 where current travels backwards through resistor 21A.

In this illustration, differential amplifier 22, which merely measures the difference between two voltages, generates a incorrect feedback signal indicating twice the actual current in the circuit.

The prior art requires the controller to correct for this erroneous signal by knowing when the H-bridge circuit is either being driven or is freewheeling. The controller must then compute offset and slope corrections to compensate for the erroneous feedback signal. Compensating for this incorrect signal significantly complicates the design of the control unit.

H-bridge feedback control systems would be improved by a feedback circuit which yields true amplitude and direction of current in a load during both driven and freewheeling periods.

Clearly there exists the need for a feedback circuit which provides the correct amplitude and direction of current in an H-bridge, simplifies feedback control and reduces costs.

SUMMARY OF THE INVENTION

The invention discloses a circuit for measuring the actual driving and circulating current in an H-bridge drive network without the need for offset or slope compensation. Voltages across two current sensing resistors are input to two precision half-wave rectifiers. The output of the rectifiers are input to a differential amplifier via a circuit of resistors. The differential amplifier yields a signal representative of the actual current in the H-bridge for both the driven periods and circulating (i.e. non-driven or "freewheeling") periods.

The invention solves several problems associated with the prior art. First, the invention significantly simplifies design of the controller because the feedback signal is linear and represents the actual current (both amplitude and direction) through the load. The controller no longer has to compensate for offsets and slope. Further, since the invention correctly measures both driven and circulating current, the controller no longer requires other inputs for determining if the load is being driven or is freewheeling. These improvements vastly simplify the controller design.

The invention accomplishes these improvements with a minimum of additional components. The additional components comprise two half-wave rectifiers and several resistors. The invention, shown in FIG. 4, operates as follows.

Two half-wave rectifiers 41A and 41B sense the voltage drop across sense resistors 21A and 21B. Rectifiers 41A and 41B rectify the voltage signal such that only positive signals are passed to differential amplifier 22.

Load resistors 43 help set the output impedance and voltage of the "off" rectifier (i.e. the rectifier side which is being driven negative) to a known impedance eliminating a major error produced in the prior art. Load resistors 43 are preferably small resistance as compared to the gain resistor (e.g. differential amplifier resistors) used in differential amplifier 22.

Output 22A of differential amplifier 22 is a feedback signal in volts which is representative of the current through load 13.

Therefore, an object of the invention is to generate a linear signal representative of the actual current in an H-bridge network.

A feature of the invention are two half-wave rectifiers connected between the sensing resistors and the differential amplifier of the measurement circuit.

An advantage of the invention is the ability to measure current during both the driven and non-driven periods.

Another advantage of the invention is measuring the actual(both amplitude and direction) current in the load.

Another advantage of the invention is measuring the actual current in the load without the need for offsets or slope compensation.

Yet another advantage is measuring the correct current without additional inputs indicating whether the load is in a driven or non-driven mode.

The significant features of the invention are illustrated in the figures and described more fully below.

DETAILED DESCRIPTION

Figure 4:
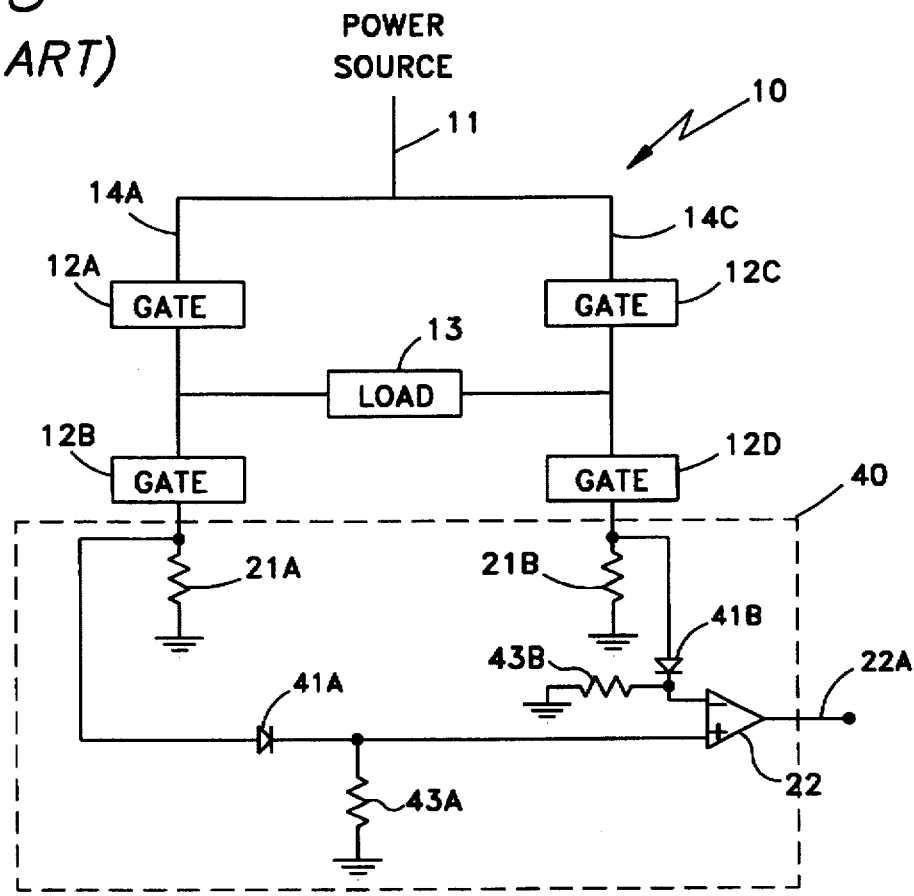
FIG. 4 illustrates the invention.

FIG. 4 illustrates the invention. Current sensing circuit 40 is comprised of sense resistors 21, half-wave rectifiers 41, load resistors 43, and differential amplifier 22.

Sensing resistors 21 are known in the art as a means for determining current in a circuit. Current flowing through a sensing resistor creates a voltage difference across the sensing resistor from which current flow is determined. One lead of each sensing resistor 21 is connected to ground. Rectifiers 41 connect to the opposite lead of each sensing resistor 21 whereby the voltage across each sensing resistor is measured. The direction of current is easily determined from the voltage. Positive voltage indicates current flow through the sensing resistor 21 to ground and negative voltage indicates current flowing the opposite direction. Sensing resistors 21 are preferably small and the preferred embodiment, which controls autothrottle servos, uses 0.15 ohm resistors.

Rectifiers 41 connect to lower legs 14B and 14D above the sensing resistors 21 such that sensing resistors 21 are between the connection point and ground. Rectifiers 41 sense the voltage difference across sensing resistors 21 and half-wave rectify this voltage signal. In the preferred embodiment rectifiers 41 pass a positive voltage signal but block a negative voltage signal. The preferred embodiment uses precision half-wave rectifiers which improve performance of the circuit.

The outputs of rectifiers 41 are input to differential amplifier 22. Rectifier 41A, in FIG. 4, is selected as the positive input to differential amplifier 22 and rectifier 41B is selected as the negative input to differential amplifier 22. Differential amplifier 22 senses the voltage difference between each rectifier 41 and generates a signal indicative of the difference.

Figure 1A:
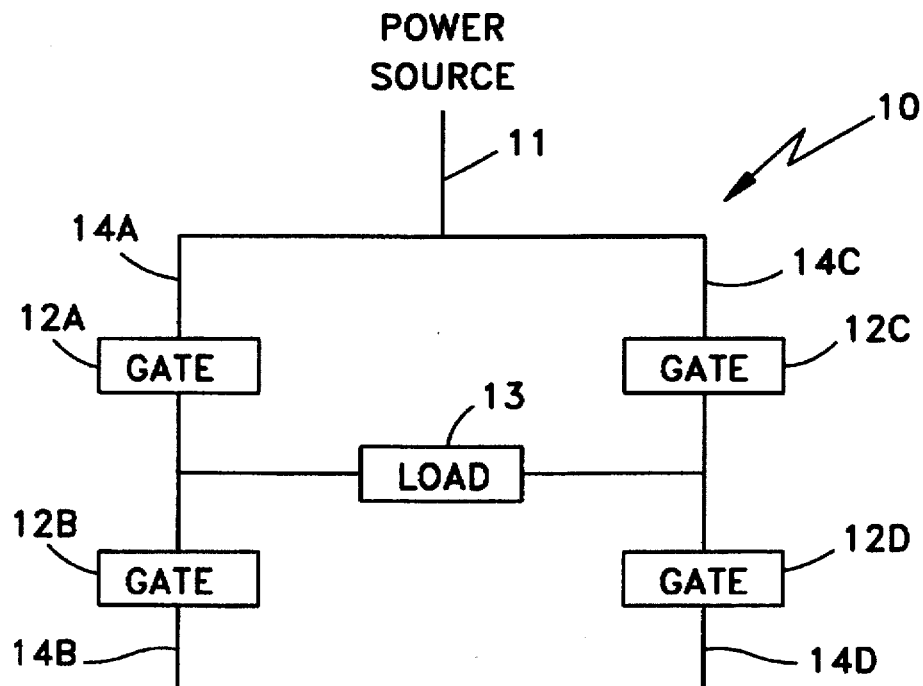
FIGS. 1A through 1E illustrate the operation of H-bridge circuits in general.
Figure 1B:
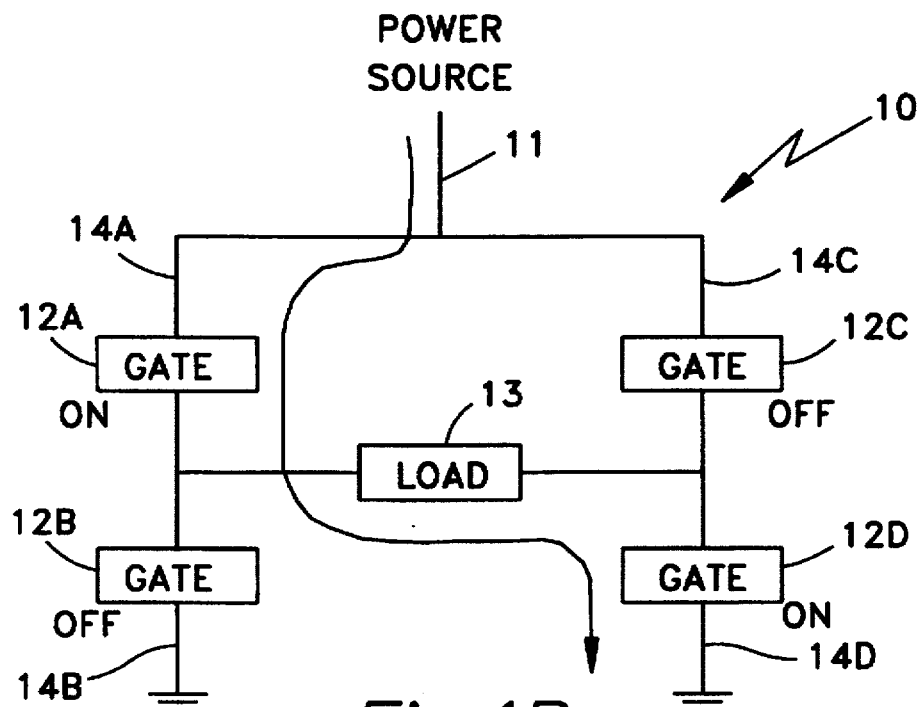
Figure 1C:
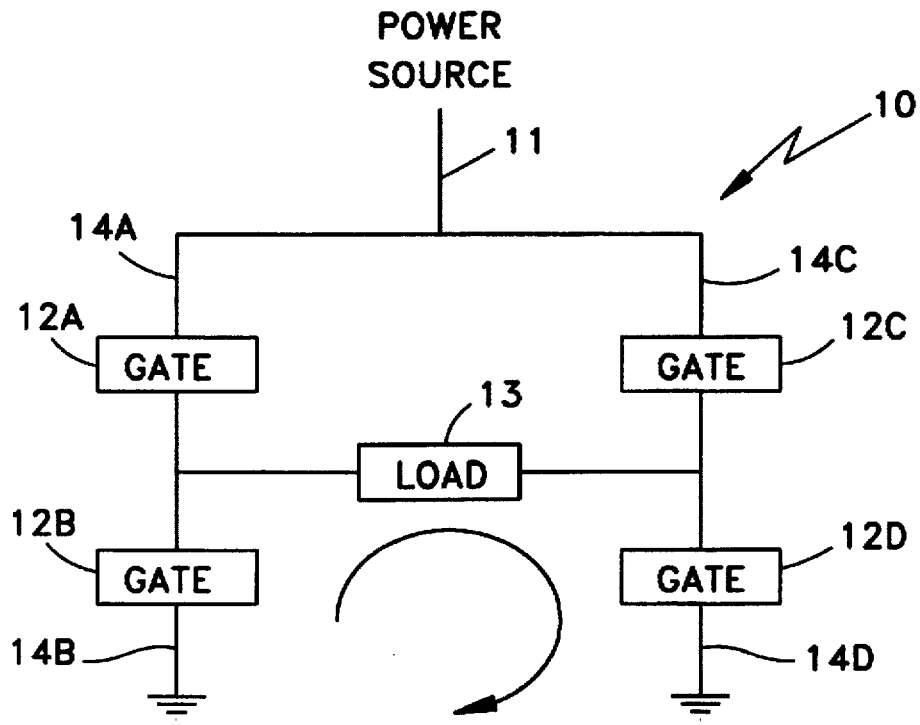
Figure 1D:
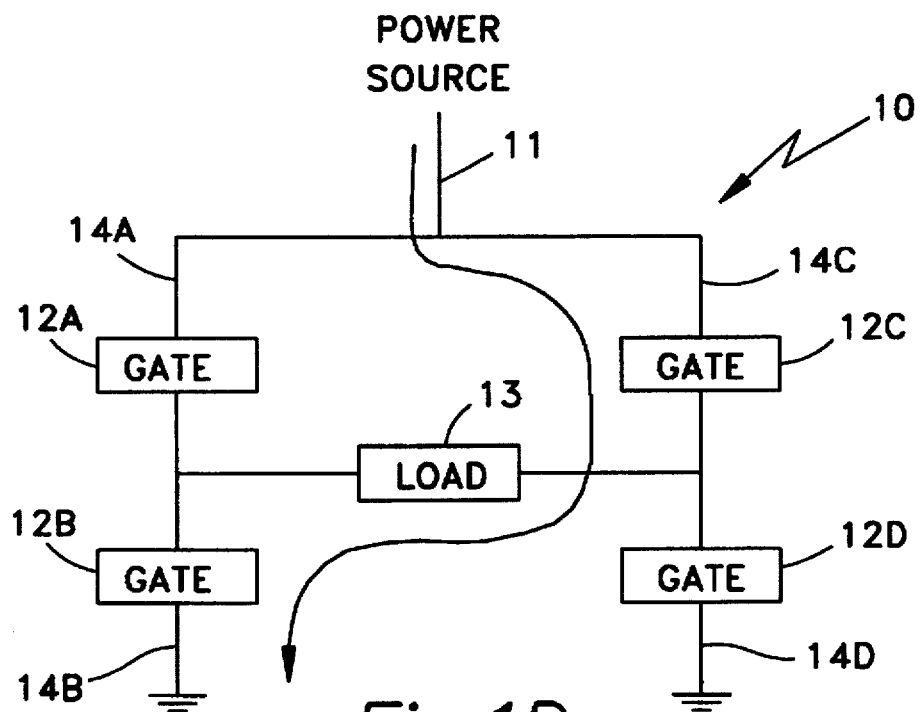
Figure 1E:
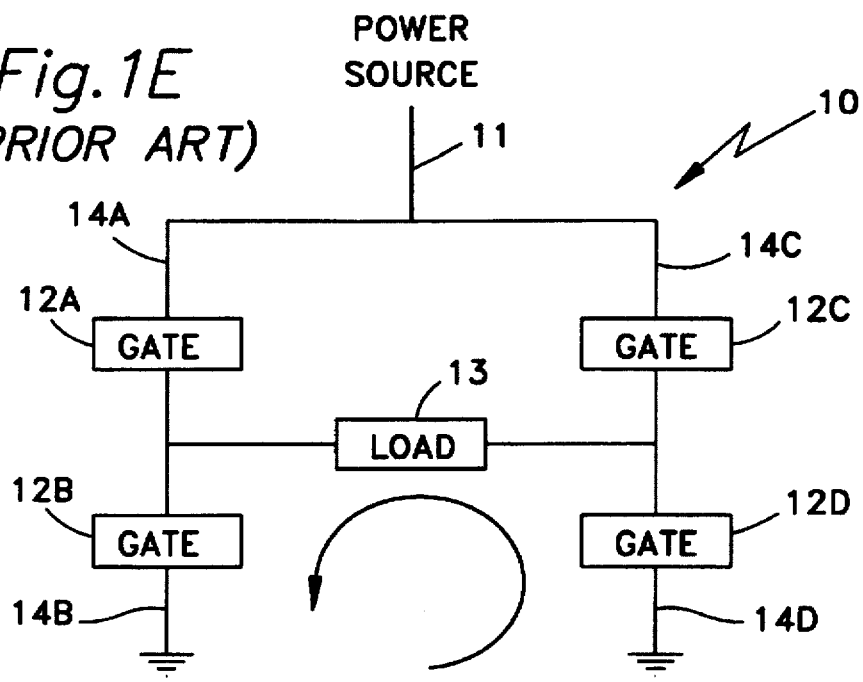
Figure 2:
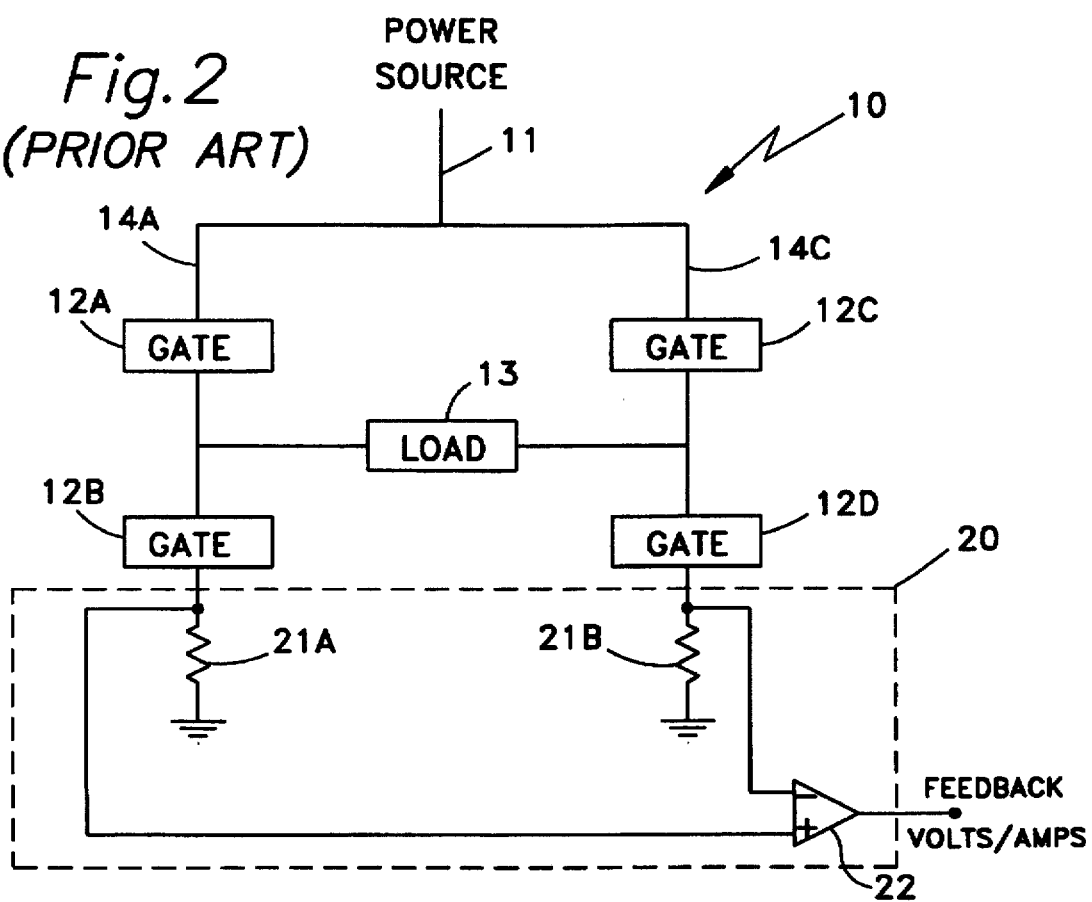
FIG. 2 illustrates the prior art current measurement circuit.
Figure 3:
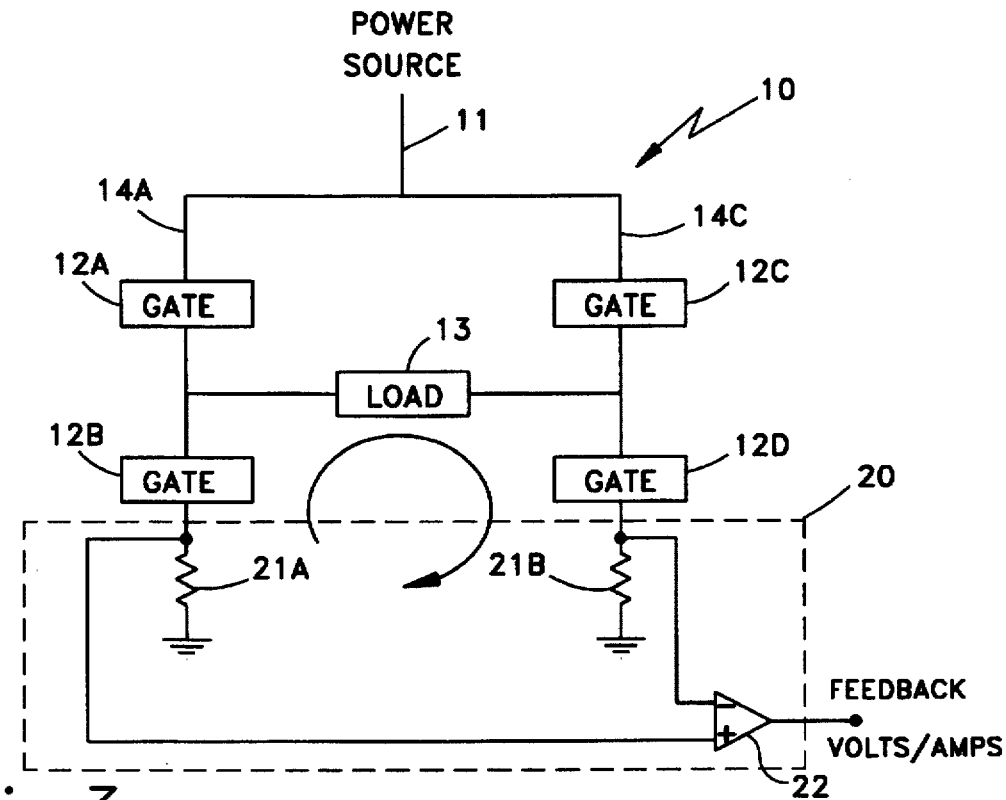
FIG. 3 illustrates the measurement problems with the prior art.

The signal generated by amplifier 22 is as follows. Signal voltage is zero when no current is flowing through load 13. Voltage is positive when current is driving load 13 as shown in FIG. 1D or is circulating, as shown in 1E. Voltage is negative when current is driving load 13 as shown in FIG. 1B or is circulating, as shown in FIG. 1C.

Figure 5:
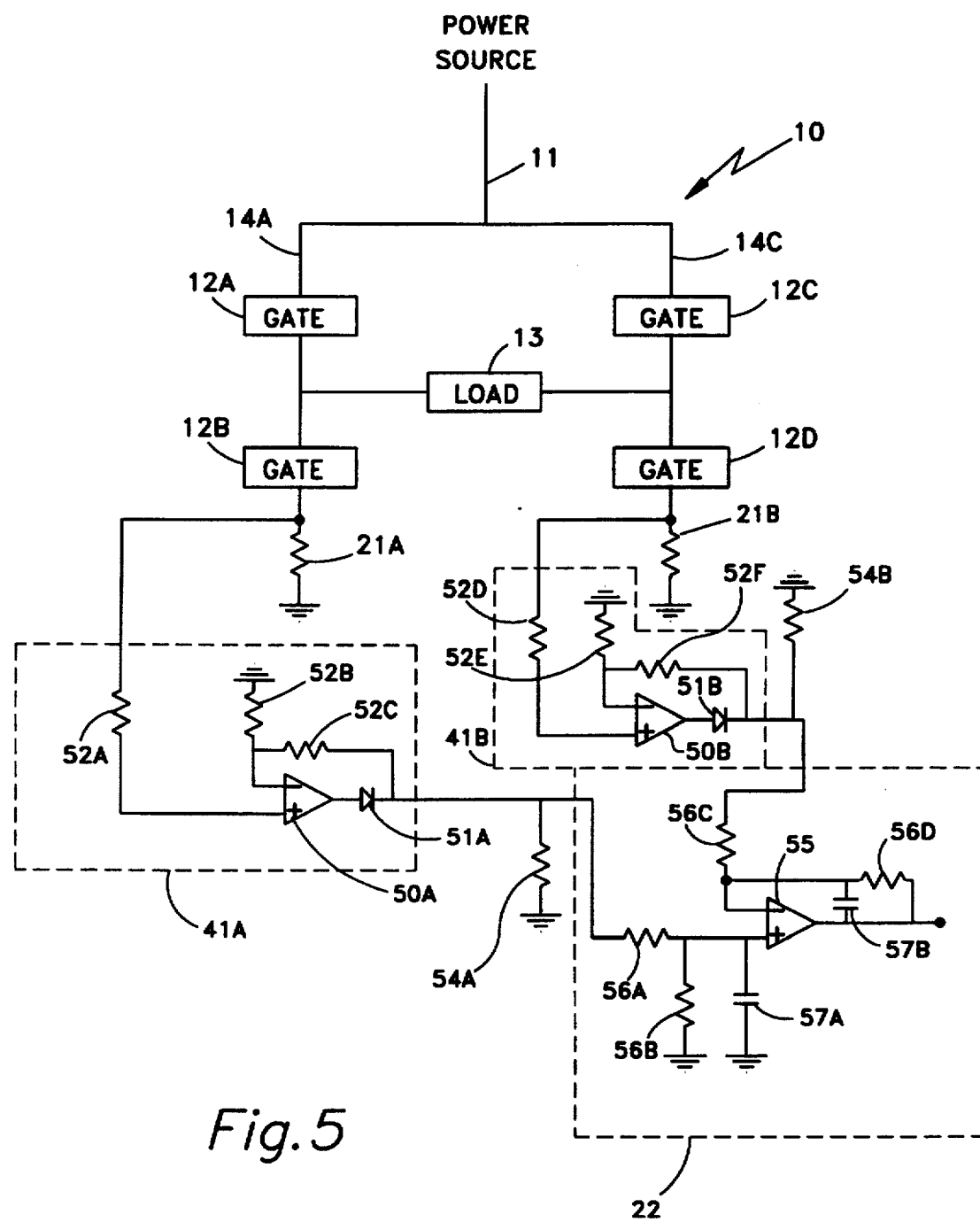
FIG. 5 illustrates the preferred embodiment of the invention.

FIG. 5 illustrates the preferred embodiment of the invention. The preferred embodiment is specifically designed for driving an electric servomotor for controlling autothrottles in an aircraft.

FIG. 5 illustrates the preferred embodiment in detail. Rectifiers 41 are shown to be comprised of an operational amplifier 50, a diode 51, and gain resistors 52. Gain resistors 52A, 52B, 52D, and 52E are 3.15K ohms. Gain resistors 52C and 52F are 105K ohms. The configuration of gain resistors 52 and operational amplifier 50 cause the signal to be amplified approximately 33.3 times. Diodes 51 assure no reverse current flows back into operational amplifiers 50.

Finite load resistors 54 improve performance of the circuit by reducing input impedance for differential amplifier 22. For this purpose, load resistors 54 should be relatively small and are selected to be 2K ohms.

Differential amplifier 22 includes an operational amplifier 55 plus several peripheral components. The peripheral components include differential amplifier resistors 56 and capacitors 57. In the preferred embodiment all the differential amplifier resistors 56 are 105K ohms. Those skilled in the art understand that such a configuration of resistors combined with operational amplifier 55 will yield a unitary transfer function (i.e. no gain will be imparted to the signals by the operational amplifier 55). Those skilled in the art also understand that differential amplifier resistors 56 could use different values so that operational amplifier 55 could amplify signals if desired.

It should be noted that the overall error of the circuit can be reduced by increasing the values of the differential amplifier resistors 56 and decreasing the value of the load resistors 54.

Capacitors 57 are connected as indicated. Capacitors 57 provide a high frequency roll off of the differential amplifier (i.e. low pass filter) .

The method of the invention follows from the apparatus. First, current is sensed in each of the lower legs of the H-bridge. This is preferably done using current sensing resistors as described above. Other current sensing techniques can also be used including but not limited to, current transformers and current sense HEXFETs (i.e. power MOS-FETs with current sense).

The signal from the current sensing means is then half-wave rectified. Both rectified signals are then compared and a difference signal indicative of the difference between the rectified signals is generated. More specifically, one of the rectified signals is designated as positive and one rectified signal is designated as negative such that the difference signal communicates both magnitude and direction of current in the H-bridge.

This description has been for descriptive purposes only and is not intended to limit the scope of the invention. Those skilled in the art recognize numerous alternate embodiments of the invention which deviate from the described embodiment but still perform the same work in substantially the same way to achieve substantially the same result are therefore equivalent to the invention.

It is clear from the foregoing that the present invention represents a new and useful circuit for sensing current in an H-bridge drive circuit The embodiments of an invention in which an exclusive:

1. A circuit for generating a feedback signal representative of current in an H-bridge drive network, said network having two upper legs, two lower legs and a load connected between said legs, said circuit comprising:
   a) a first current sensing resistor connected between a first of said two lower legs and ground for sensing current through said first lower leg;
   b) a second current sensing resistor connected between a second of said two lower legs and ground for sensing current through said second lower leg;
   c) a first rectifier having an input and an output, said input electrically connected to said first lower leg between said load and said first current sensing resistor;
   d) a second rectifier having an input and an output, said input electrically connected to said second lower leg between said load and said second current sensing resistor; and,
   e) a differential amplifier having a first input in communication with said output of said first rectifier, a second input in communication with said output of said second rectifier, said amplifier generating a feedback signal representative of the current through said load.

2. The circuit for generating a feedback signal according to claim 1 wherein said first and second rectifiers are half-wave rectifiers.

3. The circuit for generating a feedback signal according to claim 2 wherein said load is a servomotor.

4. The circuit for generating a feedback signal according to claim 2 wherein said load is a transformer.

5. The circuit for generating a feedback signal according to claim 2 wherein said first and second rectifiers are precision rectifiers.

6. The circuit for generating a feedback signal according to claim 5 wherein said load is an autothrottle servomotor.

7. The circuit for generating a feedback signal according to claim 2 wherein said differential amplifier includes:
   a) a first differential amplifier resistor connected between said first rectifier and said first input of said differential amplifier;
   b) a second differential amplifier resistor connected between said first input and ground;
   c) a third differential amplifier resistor connected between said second rectifier and said second input of said differential amplifier; and,
   d) a fourth differential amplifier resistor connected between an output of said differential amplifier and said second input.

8. The circuit for generating a feedback signal according to claim 2 wherein said load is a resistive element.

9. An apparatus for measuring current in an H-bridge network, said network having first and second lower legs, said apparatus comprising:
   a) first and second current sensing means for sensing current, said first current sensing means for sensing current in said first lower leg and generating a first signal indicative thereof, said second current sensing means for sensing current in said second lower leg and generating a second signal indicative thereof;
   b) first and second rectifier means for half-wave rectifying said first and second signals, said first rectifier means having an input in communication with said first current sensing means for receiving said first signal and an output for communicating a first rectified signal, said second rectifier means having an input in communication with said second current sensing means for receiving said second signal and an output for communicating a second rectified signal;
   c) difference means for generating a difference signal indicative of the difference between said first and second rectified signals, said difference means having a first input in communication with said output of said first rectifier means and a second input in communication with said output of said second rectifier means, wherein said difference signal is representative of the current flow in said H-bridge.

10. The apparatus for measuring current in an H-bridge network according to claim 9 wherein said current sensing means are sensing resistors.

11. The apparatus for measuring current in an H-bridge network according to claim 9 wherein said first and second rectifier means are diodes.

12. The apparatus for measuring current in an H-bridge network according to claim 9 wherein said first and second rectifier means are precision rectifiers.

13. The apparatus for measuring current in an H-bridge network according to claim 9 wherein said difference means comprises a differential amplifier.

14. A method of generating a signal indicative of current in an H-bridge network, said network having first and second lower legs, said method comprising the steps of:
   a) sensing the current amplitude and direction in said first and second lower legs and generating a first and second current signal indicative thereof;
   b) half-wave rectifying said first and second current signals and generating first and second rectified signals indicative thereof; and,
   c) comparing said first and second rectified signals and generating a feedback signal indicative thereof.

* * * * *